(12) United States Patent
Pavlenko et al.

(10) Patent No.: US 6,563,043 B2
(45) Date of Patent: May 13, 2003

(54) SYSTEM AND METHOD FOR GENERATING A RIGHT TORSION FIELD

(75) Inventors: Anatoliy R. Pavlenko, Kiev (UA); Olexander A. Pavlenko, Kiev (UA)

(73) Assignee: Alpha-E, L.L.C., Deerfield, IL (US)

(*) Notice: Subject to any disclaimer, the term of this patent is extended or adjusted under 35 U.S.C. 154(b) by 0 days.

(21) Appl. No.: 09/992,918

(22) Filed: Nov. 16, 2001

(65) Prior Publication Data

US 2002/0074507 A1 Jun. 20, 2002

Related U.S. Application Data

(60) Provisional application No. 60/249,156, filed on Nov. 16, 2000.

(51) Int. Cl.[7] .................................................. H05K 9/00
(52) U.S. Cl. .................................. 174/35 R; 250/505.1
(58) Field of Search .......................... 174/35 R, 35 MS; 361/816, 818; 206/719, 720, 721; 250/505.1, 506.1, 507.1, 515.1

(56) References Cited

FOREIGN PATENT DOCUMENTS

| EP | 229874 A1 | * 7/1987 | ............ A61N/1/16 |
|---|---|---|---|
| RU | 2146952 C1 | * 3/2000 | ............ A61N/1/16 |
| WO | WO 200218007 A1 | * 3/2002 | ............ A61N/1/16 |

OTHER PUBLICATIONS

Boris Stanislavovich, "On Torsion Fields," Galilean Electrodynamics, spec. issue., No. 1, p.5–11, Spring 2001.*

* cited by examiner

*Primary Examiner*—Dean A. Reichard
*Assistant Examiner*—Carmelo Oliva
(74) *Attorney, Agent, or Firm*—Sonnenschein, Nath & Rosenthal

(57) ABSTRACT

A device for generating a right torsion field having an outer body, a salt solution, and a ring. The ring generates a first right torsion field. The ring and the salt solution are disposed within the outer body such that a portion of the first right torsion field propagates through the salt solution.

19 Claims, 5 Drawing Sheets

SYSTEM AND METHOD FOR GENERATING A RIGHT TORSION FIELD

RELATED APPLICATIONS

This application claims priority from and incorporates by reference the provisional patent application Serial No. 60/249,156 filed on Nov. 16, 2000 entitled "System and Method of Generating a Torsion Field."

FIELD OF THE INVENTION

This invention relates to torsion fields, an in particular to a device for providing protection from torsion fields for users of electronic equipment.

BACKGROUND OF THE INVENTION

Torsion fields are generated by the classical spin, or by the spin angular momentum density (on a macroscopic level) of any object. The spinning of an object sets up polarization in two spatial cones, corresponding to a left torsion field and a right torsion field. At an atomic level, nuclear spin as well as full atomic movements may be the source of torsion fields. This means that all objects in nature, live or dead, generate their own torsion field.

Unlike electromagnetic and gravitation fields that have central symmetry, torsion fields have axial symmetry. Torsion fields are also different from electromagnetic fields in that torsion fields having an opposite spin repel each other. Torsion fields may also propagate through physical media without interacting with the media. Thus, torsion fields may not be shielded by most materials. However, a propagating torsion field alters the spin state of the media it propagates through.

Since all substances have their own stereochemistry which determines not only the location of atoms in molecules, but also determines their mutual spin orientation, then the superposition of the torsion fields generated by the atomic and nuclear spins of each molecule determines the intensity of the torsion field in the space surrounding each molecule. The superposition of all these torsion fields determines the intensity and spatial configuration of the characteristic torsion field for that substance. Thus, each physical object, whether living or non-living, possesses its own characteristic torsion field.

Torsion fields may also be generated by other methods in addition to the classical spin of particles. A wide spectrum of geometric forms of substances and objects are a natural source of torsion fields. Objects with a certain surface geometry will simultaneously generate left and right torsion fields of a certain configuration depending on the geometry of the object. Examples include, pyramids, cones, tridents, cylinders, and flat triangles.

Torsion fields are also generated by electromagnetic fields. Since charge polarization simultaneously results in a loss of equilibrium in charge and spin, an electrostatic field is also followed by a torsion field. Thus, sources of electromagnetic and electrostatic fields are always sources of torsion fields.

As electromagnetic fields are accompanied by torsion fields, most electronic devices, such as computer monitors and televisions are sources of torsion fields. Thus, torsion fields are generated during the operation of a monitor or television. Once the monitor or television is turned off, disturbances disappear and spatially split particles and antiparticles of phytons return automatically to their stable symmetric state. However, even after being shut off, the static torsion field created by the luminescent screen of the television or monitor does not disappear for some time.

The property of spin of the molecules in each object is subject to influence by external torsion fields. Thus, the structure of the torsion field of each physical object can be altered by the influence of an external torsion field. The influence of an external torsion field would result in a new configuration of the torsion field in the object. This new torsion field would be fixed as a metastable state and will remain intact even after the source of the external torsion field is removed.

Published studies have shown that exposure to left torsion fields may have a negative effect on the human body, while right torsion fields may actually have a positive effect. The negative effects of left torsion fields may include a decline in the response of the immune system and a susceptibility to disease.

SUMMARY OF THE INVENTION

The present invention relates to a device for generating a right torsion field. The device includes an outer body, a salt solution, and a ring. The ring generates a first right torsion field and is disposed so that a portion of the first right torsion field propagates through the salt solution.

In one embodiment of the invention, the outer body has a first chamber and a second chamber. The salt solution is disposed the first chamber and the ring is in the second chamber. The first chamber and the second chamber are then positioned so that a portion of the right torsion field propagates through the salt solution.

The salt solution may include a rare earth metal salt. The salt solution may also include several different rare earth metal salts. In one embodiment, the salt solution includes approximately 5% Cerium, 5% Lutetium, and 5% Erbium by composition.

The ring may also have a first end and a second end forming a gap in the ring. The ring may further have ball members attached to each end. The ring and associated ball members may inherently produce a first right torsion field an a second right torsion field. In order to increase the strength of the torsion fields, the ring and associated ball members may be constructed out of a metallic material.

In accordance with another aspect of this invention a device for generating a right torsion field may include an outer body, a salt solution, a first ring and a second ring. The salt solution, first ring and second ring are disposed in the outer body. The first and second rings are concentric and together generate a right static torsion field. The salt solution, first ring, and second rings are disposed such that the right torsion field generated by the rings propagates through the salt solution. In one embodiment, the outer body may have a first chamber and a second chamber where then salt solution is in the first chamber and the rings are in the second chamber.

The first ring and the second ring may also each have a gap. In one embodiment, the gaps for each of the rings are positioned such that the gap in the first ring is 180 degrees from the gap in the second ring. The device may also include a third ring in the second chamber. The third ring may also have a gap. The gap in the third ring may be positioned 180 degrees from the gap in the second ring.

In accordance with another aspect of this invention a method of significantly decreasing the presence of left torsion fields about an electronic device includes the steps of generating a right torsion field, propagating the right torsion field through a salt solution, and directing the right torsion field substantially perpendicular to a left torsion field generated by the electronic device.

DETAILED DESCRIPTION

Figure 1:
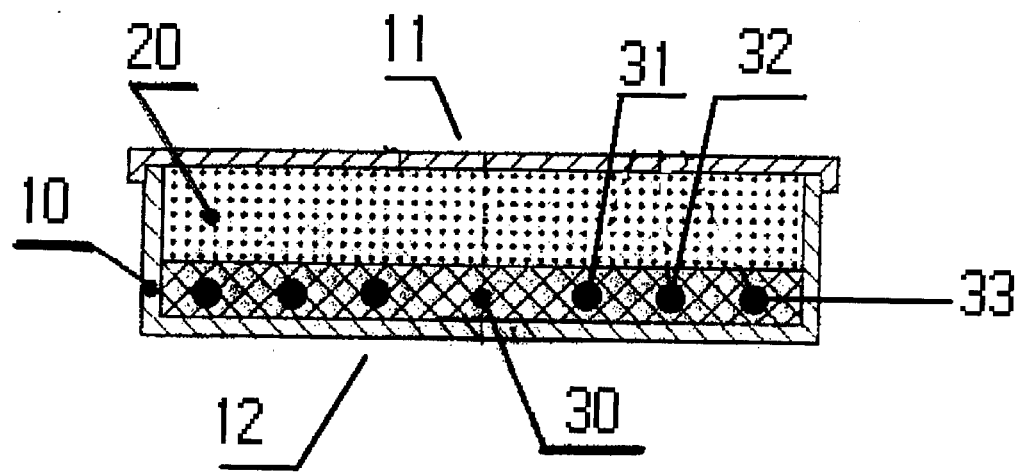
FIG. 1 is a side cross-section of one embodiment of the present invention.

FIG. 1 depicts one potential embodiment of a device for generating a right torsion field to provide significant protection to a user from left torsion fields, especially those generated by electronic equipment. The device includes an outer body 10 having a first chamber 20 and a second chamber 30. In one embodiment the outer body 10 is in the shape of a disk and is constructed from an inert plastic mass that does not affect the functionality of the device. Of course the outer body may be cylindrical, rectangular, or any other shape, and may also be constructed from any other material that would not interfere with the generation of torsion fields by the present invention.

The first chamber 20 includes a salt solution. The salt solution may include water plus any element that would provide a significant number of positive and negative ions in the solution. For example, the salt solution may be natural sea water. The salt solution may alternatively be comprised of water and ordinary table salt. The water in the solution may also be substituted with another liquid as long as the liquid is capable of inherently generating a torsion field. The use of various elements, as well as various combinations of elements will result in varying torsion field strengths generated by the present device. Along with the choice of elements, the strength of the generated torsion field is also affected by the concentration of each element in the solution, the hydration of each element, and the temperature of the solution.

In one embodiment, the salt solution includes a rare earth metal salt. The rare earth metal salt may be any element with an atomic numbers from 58 to 71 (inclusive) on the periodic chart. By using a salt solution including rare earth metals, the strength of the torsion field generated by the present invention is increased in comparison to any other type of salt solution. In one approach, the salt solution includes three different elements. The salt solution may be approximately 5% Cerium, 5% Lutetium, and 5% Erbium by composition. However, any other rare earth metal salt may be used in addition to or in place of the these elements. The concentration of the element may also be varied.

The salt solution generates left and right torsion due to the movement of opposite ions in opposite directions. The ions are set into motion by the magnetic fields generated by the magnetic poles of the earth. Hydroxyl ions and hydroxonium ions that are inherently present in the solution are set into motion as a result of the magnetic fields. The trajectories of movement of the hydroxyl and hydroxonium ions are cycloids.

Since water molecules have a high dipole moment, the hydroxyl and hydroxonium ions that move from the point where they have appeared during dimer decomposition and rotate in the same area but in opposite directions will orient the nearest water molecules as if stringing them on the arch of a cycloid. This results in the unification of molecules situated on the hydroxile and hydroxone arches into flat circular associates due to collective aquatic links. Circular associates that appear are extremely passive because they are unpolar, neutral and slow moving due to their large size and weight. This makes the reconstruction of water into regulated ice-like structures easier. The ice-like structures generate the left and right torsion fields.

The strength of the left and right torsion fields generated by the salt solution alone is related to the volume of solution present. However, the volume necessary to generate a torsion field with sufficient strength to repel a left torsion field from electronic equipment would be too large for convenient use.

The first chamber 30 includes at least one ring. In one embodiment, the ring may be substantially cylindrical in cross-section. The ring may alternatively have a flat-cross-section or any other shape. The cross-sectional diameter of the rings may also be varied. The rings are preferably metallic, such as zinc or copper but may also be constructed out of any other material that inherently produces a torsion field. The shape and material of the ring will affect the strength of the torsion field generated by the ring.

Figure 2:
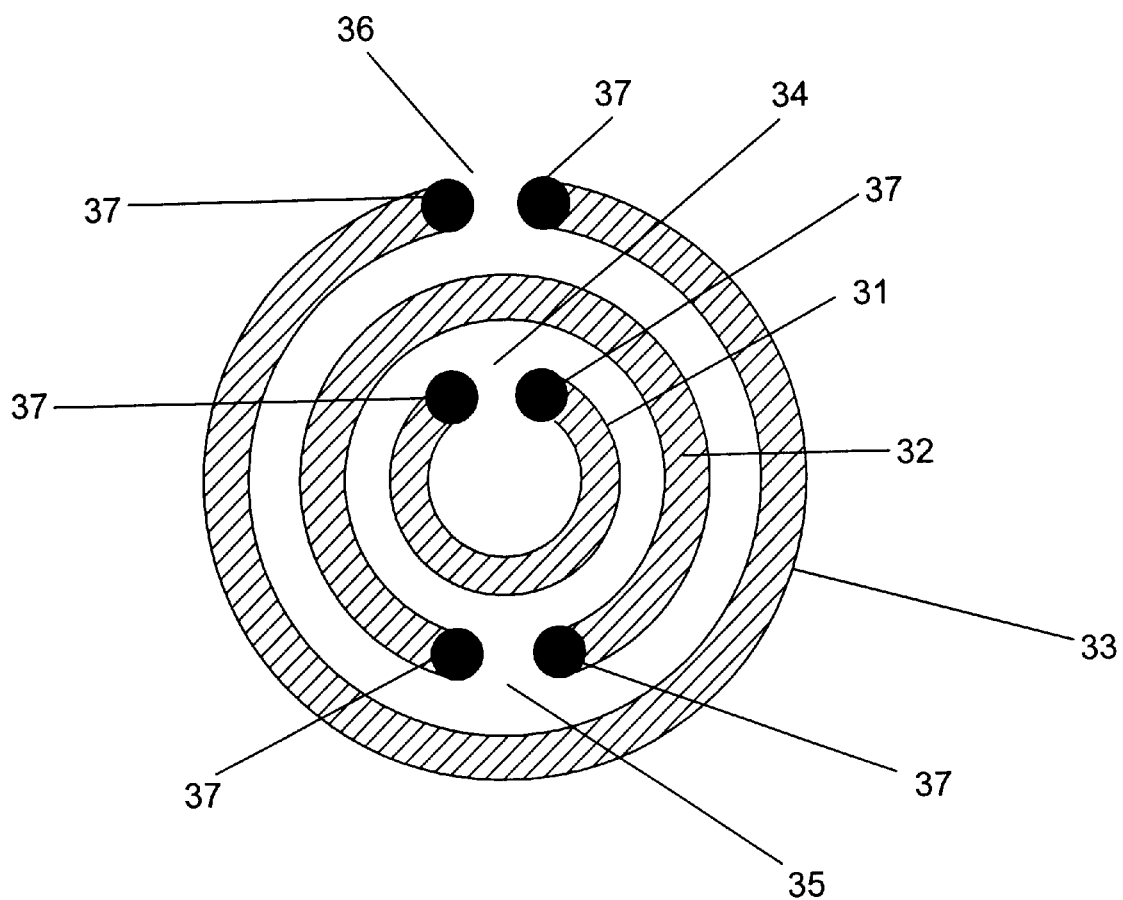
FIG. 2 is a top view of one embodiment of the rings located in the second chamber.

In one embodiment shown in FIG. 2, the first chamber 30 includes an inner ring 31, a central ring 32, and an outer ring 33. The three rings 31,32, and 33 are positioned concentric to one another on the horizontal plane. In one approach, each of the three rings is discontinuous, forming gaps in each ring. Thus, the inner ring 31 has a first gap 34, the central ring 32 has a second gap 35, and the outer ring 33 has a third gap 36. The rings may be oriented such that the gap for each rings is positioned 180 degrees from the gap in an adjacent ring along the horizontal plane. Thus, the first gap 34 may be positioned 180 degrees from the second gap 35. Similarly, the second gap 35 is 180 degrees from the third gap 36. Preferably, the size of the gap in each ring is the same. However, the size of the gap in each ring may be altered and each gap may be different in size from each other gap.

The number of rings in the second chamber may be varied. By increasing the number of rings, the overall strength of the torsion field generated by the present invention would be increase. Conversely, reducing the amount of rings, reduces the overall strength of the torsion field. Furthermore, the strength of the torsion field may also be varied by changing the spacing between the rings.

Each of the three rings may further include a ball member 37 attached to each end of the each of the three rings. Each ball member is also preferably metallic, but may be any other material capable of inherently generating torsion fields. The diameter of each ball member may be varied and the diameter of each ball member is not necessarily the same diameter as any other ball member. The shape, size, and material of the ball members will affect the strength of the generated torsion field.

The second chamber may further include an inert mass, preferably plastic. In one embodiment, the inert mass fills the second chamber, which holds the three rings in a predetermined position. The inert mass has no significant effect on the generation of torsion fields.

Figure 3A:
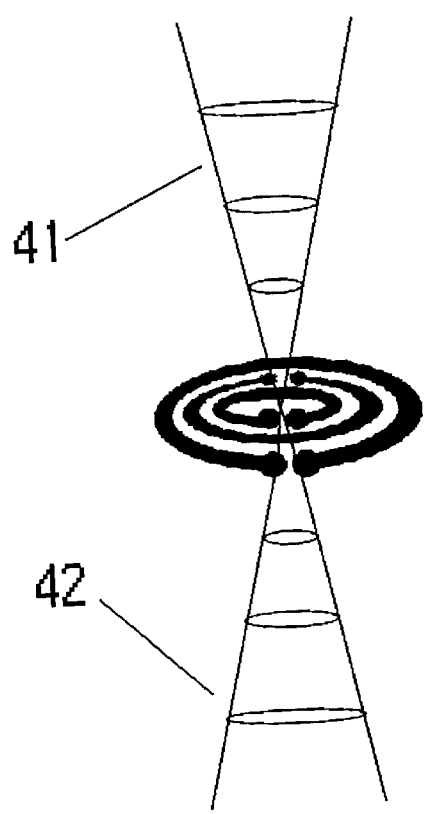
FIGS. 3a and 3b are schematic views for comparison of the torsion fields generated by the rings alone and the torsion fields generated by the rings in conjunction with the salt solution in one embodiment of the invention.

The three rings, along with the associated ball members 37 act as topological resonators that generate two right static torsion fields, as shown in FIG. 3a. The right static torsion fields appears as a result of the local properties of topology of the three rings and the associated ball members.

Figure 3B:
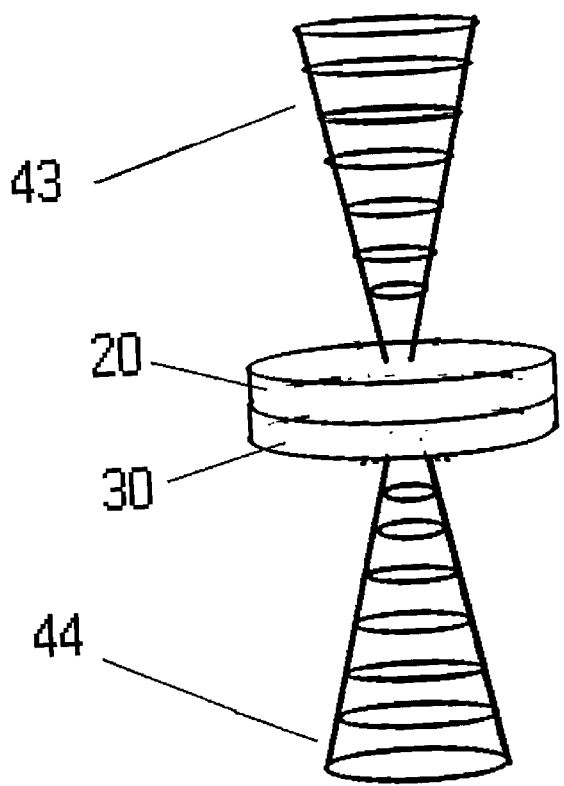

The first chamber and the second chamber are positioned such that at least one of the right torsion fields propagates through the salt solution. Thus, the first right static field propagates through the salt solution while the second right static torsion field does not. As shown in FIG. 3b, the interaction between the first right static torsion field generated by the rings and the torsion field generated by the salt solution increases the overall strength of the right torsion field generated by the present invention. Furthermore, because the first right static torsion fields is strengthened due to the interaction with the salt water, the strength of the second right static torsion field is also increased.

In another approach, present invention may include a third chamber that also includes salt solution. The third chamber may be located adjacent to the second chamber on the opposite side from the first chamber. In this approach, both the first right static torsion field 41 and the second right static torsion field 42 generated by the rings would propagate through a salt solution, further increasing the overall torsion fields generated by the present invention.

In yet another approach, the salt solution and the ring may be disposed in the same chamber such that this salt solution surrounds the rings. In this approach, both the first right static torsion field 41 and the second right static torsion field 42 generated by the rings may propagate through a salt solution.

Thus, the present invention using the salt solution in conjunction with the rings generates a first right torsion field 43 and a second right torsion field 44 that are stronger than the first right static field 41 and second right static field 42 generated by the rings alone. Each of the right torsion fields 43 and 44 is individually significantly strong enough to repel a left torsion field generated by most electronic equipment. Although a left torsion field (not shown) is also generated by the salt solution, the strength of the left torsion field is negligible as compared to the two right torsion fields.

Figure 4:
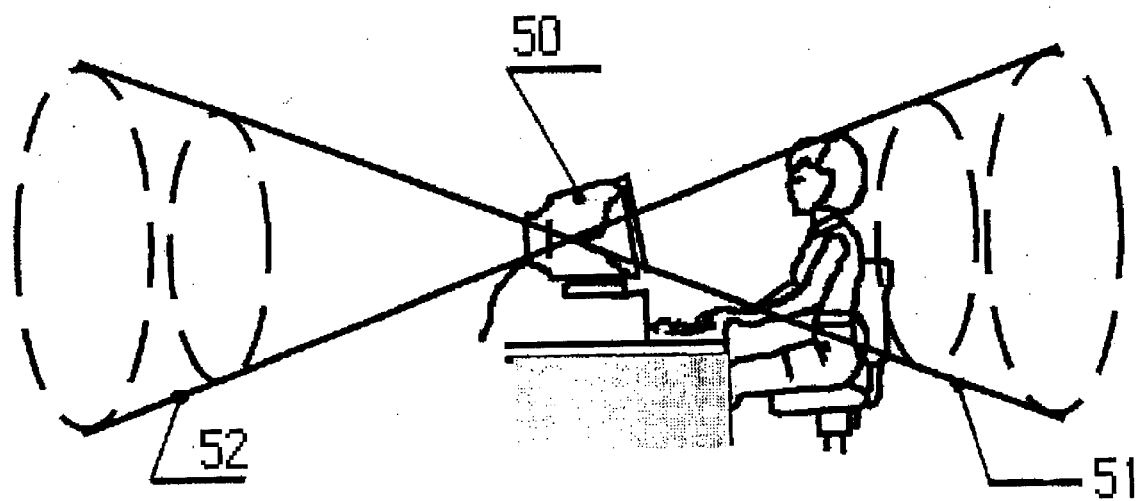
FIG. 4 is a view of the torsion fields generated by a monitor or television.

As shown if FIG. 4, a television or monitor 50 typically generates a left torsion field 51 from the front of the television or monitor or television, towards the direction of the user, and a right torsion fields 52 towards the rear of the television or monitor.

Figure 5:
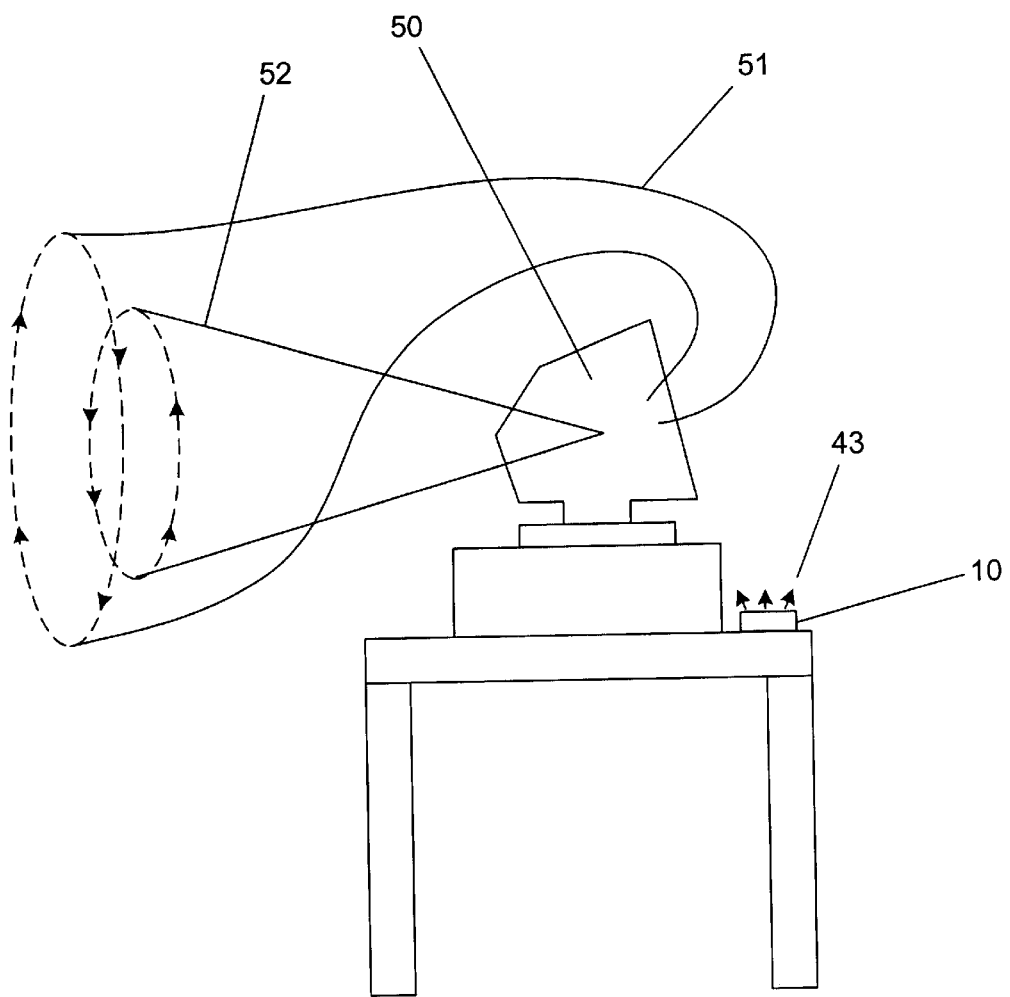
FIG. 5 is a view of the effect of the present invention on the torsion fields of the monitor or television.

The present invention may be placed in front of the television or monitor, between the user and the electronic device. Preferably, the present invention is positioned such that either face 11 or 12 of the outer body is directed substantially perpendicular to a cathode ray tube of the monitor or television (see FIG. 5). This ensures that the right torsion field generated by the present invention is substantially perpendicular to the left torsion field generated by the cathode ray tube. The present invention may be placed on the desk or counter between the electronic device and the user, or alternatively, it may be attached to a wall or ceiling.

Since the right torsion field 43 generated by the present invention is perpendicular to the left torsion field generated by the monitor or television, the right torsion field 43 repels the left torsion field 51 and deflects the left torsion field 51 generated by the monitor or television or monitor about 180 degrees. (See FIG. 5) This forces the left torsion field 51 generated by the monitor or television to overlap with the right torsion field 52 emanating from the rear of the monitor or television. Since the left 51 and right 52 torsion fields from the monitor are generated by the same source, the left torsion field and right torsion fields coincide and compensate for each other, effectively decreasing the effects of each field. This interaction creates a generally harmonized space surrounding the monitor such that there is a significant decrease in the presence of any left torsion fields in front of and behind the monitor.

It should be noted that the present invention may be used to decrease the effects from torsion fields generated by any electrical equipment, including phones, vehicles, stereos, etc. For each device, the number of rings, the spacing between the rings, and the rare earth elements used may be altered in order to generate the appropriate right torsion field in order to repel the left torsion field from the associated electronic equipment.

We claim:

1. A device for generating a right torsion field comprising:
   an outer body;
   a salt solution disposed in the outer body; and
   a ring disposed in the outer body that generates a first right torsion field,
   the ring and the salt solution being disposed such that a portion of the first right torsion field propagates through the salt solution.

2. The device of claim 1 wherein the outer body has a first chamber and a second chamber; the salt solution is disposed in the first chamber; the ring is disposed in the second chamber; and the first and second chambers are disposed such that a portion of the first right torsion field propagates through the salt solution.

3. The device of claim 1 wherein the salt solution inherently produces a left torsion field and a right torsion field.

4. The device of claim 1 wherein the salt solution includes a rare earth metal salt.

5. The device of claim 4 wherein the salt solution includes approximately 5% Cerium, 5% Lutetium, and 5% Erbium by composition.

6. The device of claim 1 wherein the ring is metallic.

7. The device of claim 1 wherein the ring inherently produces a first right torsion field.

8. The device of claim 7 wherein the ring generates a second right torsion field.

9. The device of claim 8 wherein the ring inherently produces a second right torsion field.

10. The device of claim 1 wherein the ring has a first end and a second end forming a gap in the ring.

11. The device of claim 10 further including a first ball member attached to the first end of the ring and a second ball member attached to the second end of the ring.

12. The device of claim 11 wherein the first ball member and the second ball member are metallic.

13. The device of claim 12 wherein the ring, the first ball member, and the second ball member inherently produces a right torsion field.

14. A device for generating a right torsion field comprising:
   an outer body;
   a salt solution disposed in the outer body;
   a first ring and a second ring disposed in the outer body, the first ring being concentric with the second ring; wherein the first ring and the second ring together generate a right static torsion field; and
   the salt solution and the first and second rings being disposed such that a portion of the right static torsion field propagates through the salt solution.

15. The device of claim 14 wherein the outer body has a first chamber and a second chamber; the salt solution is disposed in the first chamber; the first ring and the second ring are disposed in the second chamber; and the first chamber and the second chamber are disposed such that a portion of the right static torsion field propagates through the salt solution.

16. The device of claim 15 wherein the first ring has a first gap and the second ring has a second gap; the first gap being positioned approximately 180 degrees from the second gap.

17. The device of claim 16 further including a third ring concentric with the second ring, the third ring having a third gap positioned approximately 180 degrees from the second gap.

18. The device of claim 17 wherein the salt solution includes a rare earth metal salt.

19. A method of significantly decreasing the presence of left torsion fields about an electronic device comprising:
   generating a right torsion field;
   propagating the right torsion field through a salt solution; and
   directing the right torsion field substantially perpendicular to a left torsion field generated by the electronic device.

* * * * *